United States Patent
Kwon et al.

(10) Patent No.: US 10,145,876 B2
(45) Date of Patent: Dec. 4, 2018

(54) ELECTROMAGNETIC WAVE POWER SENSING APPARATUS AND SYSTEM COMPRISING THEREOF

(71) Applicant: KOREA RESEARCH INSTITUTE OF STANDARDS AND SCIENCE, Daejeon (KR)

(72) Inventors: Jae-Yong Kwon, Daejeon (KR); Dong-Joon Lee, Daejeon (KR)

(73) Assignee: Korea Research Institute of Standards and Science, Daejeon (KR)

( * ) Notice: Subject to any disclaimer, the term of this patent is extended or adjusted under 35 U.S.C. 154(b) by 540 days.

(21) Appl. No.: 14/960,547

(22) Filed: Dec. 7, 2015

(65) Prior Publication Data
US 2016/0161535 A1 Jun. 9, 2016

(30) Foreign Application Priority Data
Dec. 5, 2014 (KR) .................. 10-2014-0173852

(51) Int. Cl.
*G01R 21/00* (2006.01)
*G01R 29/08* (2006.01)

(52) U.S. Cl.
CPC ..... *G01R 29/0892* (2013.01); *G01R 29/0857* (2013.01)

(58) Field of Classification Search
CPC .. G01R 21/00; G01R 21/001; G01R 29/0857; G01R 29/0892; G01R 1/04; G01R 1/06;
(Continued)

(56) References Cited

U.S. PATENT DOCUMENTS 4,287,418 A * 9/1981 Divin .................. G01J 3/28
250/336.1
5,123,733 A * 6/1992 Divin ................. H01L 39/223
250/336.2
(Continued)

FOREIGN PATENT DOCUMENTS

KR 10-0590801 B1 6/2006
KR 2009-0057024 A 6/2009
(Continued)

*Primary Examiner* — Thang Le
(74) *Attorney, Agent, or Firm* — Harness, Dickey & Pierce, P.L.C.

(57) ABSTRACT

Provided is an electromagnetic wave power sensing apparatus. The electromagnetic wave power measuring apparatus includes a waveguide to which electromagnetic wave power is incident, an electromagnetic wave absorber disposed at a termination of the waveguide and absorbing the electromagnetic wave power incident to a front surface of the electromagnetic wave absorber, parallel plates disposed at a rear of the electromagnetic wave absorber and arranged on and under a center line of the waveguide, a waveguide guide for fixing the waveguide and the electromagnetic wave absorber, wherein the parallel plates are positioned in the waveguide guide, an electro-optic element configured to sense the electromagnetic wave power, an electro-optic element fixer to which the electro-optic element is coupled, and a movement guide coupled to the electro-optic element fixer and controlling movement of the electro-optic element into the inside of the waveguide guide in order to sense the electromagnetic wave power.

19 Claims, 5 Drawing Sheets

(58) Field of Classification Search
CPC .. G01R 1/18; G01R 1/07342; G01R 1/06711;
G01R 1/06772; G01R 31/2886; G01R
31/2889; G01R 31/002; G01R 31/28;
G01R 29/0814; G01R 29/0821; G01R
29/0871; G01R 29/26; G01R 29/10;
G01R 29/08
See application file for complete search history.

(56) References Cited

U.S. PATENT DOCUMENTS

| | | | |
|---|---|---|---|
| 7,444,264 B2* | 10/2008 | Kildal | G01R 29/0821 343/703 |
| 2006/0267848 A1* | 11/2006 | Nagashima | G01R 29/10 343/703 |
| 2011/0133999 A1* | 6/2011 | Cho | G01R 29/0821 343/703 |
| 2014/0015541 A1* | 1/2014 | Sakai | G01R 29/0871 324/537 |

FOREIGN PATENT DOCUMENTS

| | | |
|---|---|---|
| KR | 2010-0013307 A | 2/2010 |
| KR | 10-1040217 B1 | 6/2011 |
| KR | 10-1071510 B1 | 10/2011 |

\* cited by examiner

ELECTROMAGNETIC WAVE POWER SENSING APPARATUS AND SYSTEM COMPRISING THEREOF

CROSS-REFERENCE TO RELATED APPLICATIONS

This U.S. non-provisional patent application claims priority under 35 U.S.C. § 119 of Korean Patent Application No. 10-2014-0173852, filed on Dec. 5, 2014, the entire contents of which are hereby incorporated by reference.

BACKGROUND

The present disclosure herein relates to an electromagnetic wave power measuring system, and more particularly, to an electromagnetic wave power sensing apparatus using an electro-optic element which enables measurement of electromagnetic wave power in a wide frequency band and a system including the same.

Electromagnetic wave power is an important measure and that directly or indirectly affects measurement of electromagnetic waves and is commonly used in the fields of communications and semiconductors.

With the wide use of vehicle collision avoidance radars and fifth generation mobile communications, it is more frequently required to measure electromagnetic wave power in a millimeter wave band.

Thermistor mounts have been used to sense electromagnetic wave power, but are applicable only for a limited frequency band due to the limitations of a thermistor manufacturing technology and discontinuity of production. Methods for sensing electromagnetic wave power using thermo-elements or diodes instead of thermistor mounts have been proposed. However, the methods for sensing electromagnetic wave power using thermo-elements are limited in terms of a frequency band, and the methods for sensing electromagnetic wave power using diodes are limited in terms of accuracy of measurement due to the nonlinearity of a diode.

Therefore, it is required to develop an electromagnetic wave power sensing apparatus capable of sensing electromagnetic wave power in a wide frequency band including a millimeter wave band while ensuring the linearity of sensing of electromagnetic wave power.

SUMMARY

The present disclosure provides an electromagnetic wave power sensing apparatus for measuring electromagnetic wave power in a wide frequency band and a system including the same.

The present disclosure also provides an electromagnetic wave power sensing apparatus for measuring electromagnetic wave power while ensuring the linearity.

An embodiment of the inventive concept provides an electromagnetic wave power measuring apparatus including: a waveguide to which electromagnetic wave power is incident; an electromagnetic wave absorber disposed at a termination of the waveguide and absorbing the electromagnetic wave power incident to a front surface of the electromagnetic wave absorber; parallel plates disposed at a rear of the electromagnetic wave absorber and arranged on and under a center line of the waveguide; a waveguide guide for fixing the waveguide and the electromagnetic wave absorber, wherein the parallel plates are positioned in the waveguide guide; an electro-optic element configured to sense the electromagnetic wave power; an electro-optic element fixer to which the electro-optic element is coupled; and a movement guide coupled to the electro-optic element fixer and controlling movement of the electro-optic element into the inside of the waveguide guide in order to sense the electromagnetic wave power.

In an embodiment, the movement guide may control the electro-optic element so that the electro-optic element is positioned between the parallel plates to measure a reference signal, and may control the electro-optic element so that the electro-optic element is positioned in the waveguide positioned at a front of the electromagnetic wave absorber to measure an electromagnetic wave power sensing signal.

In an embodiment, the parallel plates may receive one of a DC voltage and a low-frequency voltage as a reference voltage.

In an embodiment, the parallel plates may include a positive plate and a negative plate, wherein the positive plate and the negative plate may be arranged in parallel with each other on the waveguide guide.

In an embodiment, a positive plate insertion groove for inserting the positive plate and a negative plate insertion groove for inserting the negative plate may be formed in the waveguide guide.

In an embodiment, the waveguide guide may have a hole formed therein so that the electro-optic element moves therethrough with respect to the center line of the waveguide.

In an embodiment, the electro-optic element fixer may have a structure rotatable on the movement guide so as to rotate the electro-optic element.

In an embodiment, a part of the front surface of the electromagnetic wave absorber may form an inclined surface having a predetermined inclination with respect to the center line of the waveguide.

In an embodiment, the electromagnetic wave absorber may have a hole formed therein for allowing an electro-optic crystal of the electro-optic element moves forward on the waveguide.

In an embodiment, the electro-optic element fixer may have a structure rotating on the movement guide in order to obtain an optimal response characteristic from the electro-optic element.

In an embodiment of the inventive concept, a system includes: an electromagnetic wave power sensing apparatus configured to output a reference signal and a sensing signal according to a result of sensing an electromagnetic wave power signal through an electro-optic element; and a measuring apparatus configured to receive the reference signal and the sensing signal to measure electromagnetic wave power, wherein the electromagnetic wave power sensing apparatus includes: a waveguide to which electromagnetic wave power is incident; an electromagnetic wave absorber disposed at a termination of the waveguide and absorbing the electromagnetic wave power incident to a front surface of the electromagnetic wave absorber; parallel plates disposed at a rear of the electromagnetic wave absorber and arranged on and under a center line of the waveguide; a waveguide guide for fixing the waveguide and the electromagnetic wave absorber, wherein the parallel plates are positioned in the waveguide guide; an electro-optic element configured to sense the electromagnetic wave power; an electro-optic element fixer to which the electro-optic element is coupled; and a movement guide coupled to the electro-optic element fixer and placing the electro-optic element between the parallel plates to output the reference signal or placing the electro-optic element in the waveguide guide to output the sensing signal.

In an embodiment, the system may further include an electromagnetic wave power generator configured to output an electromagnetic wave power signal according to various frequency bands to the electromagnetic wave power sensing apparatus through control of the measuring apparatus.

In an embodiment, the parallel plates may include a positive plate and a negative plate arranged in parallel with each other on the waveguide guide, wherein one of a DC voltage and a low-frequency voltage may be applied as a reference voltage to the positive plate and the negative plate.

In an embodiment, a positive plate insertion groove for inserting the positive plate and a negative plate insertion groove for inserting the negative plate may be formed in the waveguide guide.

In an embodiment, the waveguide guide may have a hole formed therein so that the electro-optic element moves therethrough with respect to the center line of the waveguide.

In an embodiment, the electro-optic element fixer may have a structure rotatable on the movement guide so as to rotate the electro-optic element.

In an embodiment, a part of the front surface of the electromagnetic wave absorber may form an inclined surface having a predetermined inclination with respect to the center line of the waveguide.

In an embodiment, the electromagnetic wave absorber may have a hole formed therein for allowing an electro-optic crystal of the electro-optic element moves forward on the waveguide.

In an embodiment, the electro-optic element fixer may have a structure rotating on the movement guide in order to obtain an optimal response characteristic from the electro-optic element.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Embodiments of the inventive concept will be described in detail with reference to the accompanying drawings. It should be noted that only descriptions required for assisting with an understanding of the embodiments are provided below and unnecessary detailed descriptions are not provided below so as not to obscure the inventive concept.

The inventive concept provides an electromagnetic wave power sensing apparatus implemented using an electro-optic (EO) element.

Figure 1:
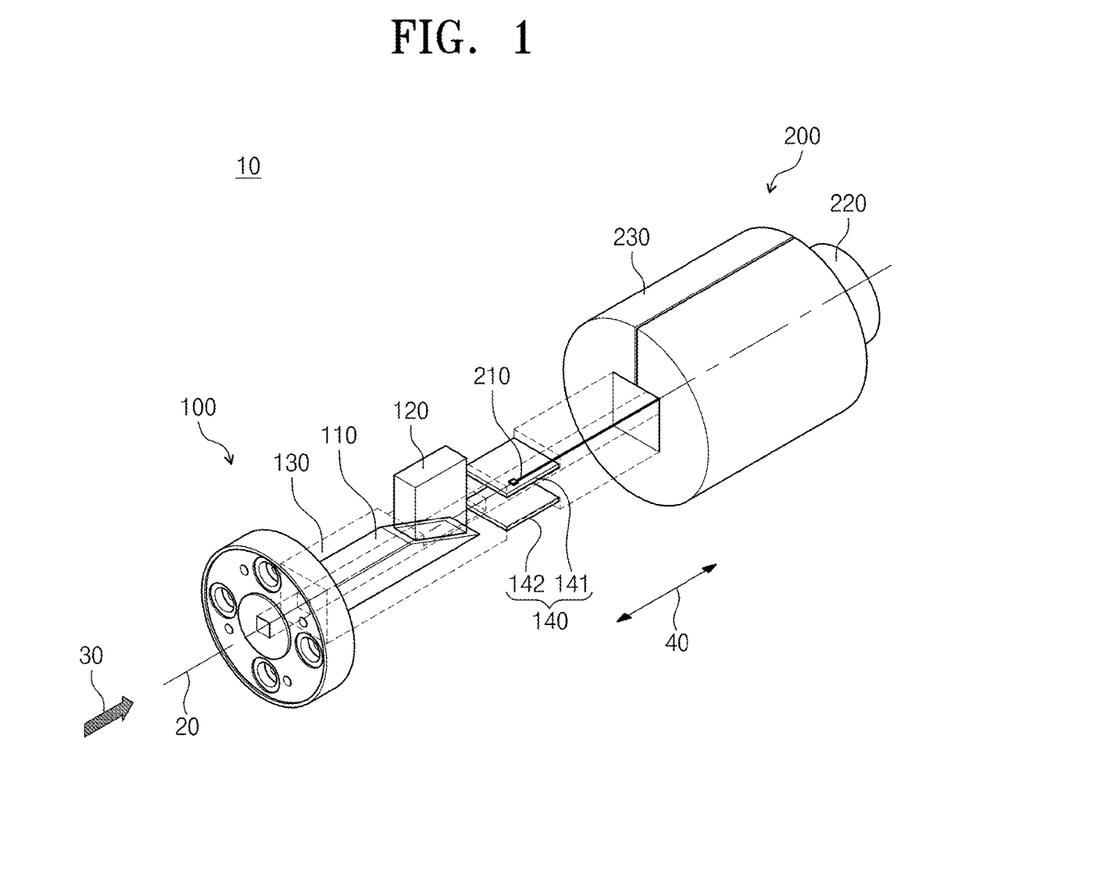
FIG. 1 is a diagram exemplarily illustrating an electromagnetic wave power sensing apparatus according to an embodiment of the inventive concept.

FIG. 1 is a diagram exemplarily illustrating an electromagnetic wave power sensing apparatus according to an embodiment of the inventive concept.

Referring to FIG. 1, an electromagnetic wave power sensing apparatus 10 includes a waveguide unit 100 and an electro-optic element unit 200. An electro-optic element 210 is coupled to the electro-optic element unit 200 to sense electromagnetic wave power introduced through the waveguide unit 100.

The waveguide unit 100 includes a waveguide 110, an electromagnetic wave absorber 120, a waveguide guide 130, and parallel plates 140.

The waveguide 110, which is a path through which electromagnetic wave power is incident, provides the electromagnetic wave power in an incident direction. A waveguide center line 20 is formed with respect to a direction 30 in which the electromagnetic wave power is incident through the waveguide 110.

The electromagnetic wave absorber 120 is coupled to a termination of the waveguide 110. The electromagnetic wave absorber 120 absorbs the electromagnetic wave power provided from the waveguide 110 so that the electromagnetic wave power is not reflected, thereby enabling accurate measurement of the electromagnetic wave power. Here, the electromagnetic wave absorber 120 has a hole formed therein so that the electro-optic element 120 passes therethrough into the waveguide 110.

The waveguide 110 and the electromagnetic wave absorber 120, and one side of the waveguide guide 130 is inserted into the electro-optic element unit 200. The waveguide guide 130 may have an internal path, i.e., a hole, formed in one side thereof coupled to the electro-optic element unit 200 so that the electro-optic element 210 moves to the waveguide 110 through the internal path.

The parallel plates 140 include two plates, i.e., a positive plate 141 and a negative plate 142. The parallel plates 140 are arranged in parallel with each other with respect to a central axis of the waveguide. The parallel plates 140 are positioned opposite to the waveguide 110 with respect to the electromagnetic wave absorber 120. Here, provided that a surface of the electromagnetic wave absorber 120 to which the electromagnetic wave power is incident is a front surface, the parallel plates 140 are positioned at the rear of the electromagnetic absorber 120.

The parallel plates 140 obtain a reference signal when the electromagnetic wave power is measured through the electro-optic element. To this end, one of a direct current (DC) voltage and a low-frequency voltage may be applied as a reference voltage to the parallel plates 140. Conductive wires (not shown) for applying a voltage may be formed in the parallel plates 140 so that the reference voltage may be applied. Here, the reference voltage to be applied to the parallel plates 140 may be generated by, for example, an external device (not shown) or a reference voltage generator (not shown) included in the electromagnetic wave power sensing apparatus 100.

The electro-optic element unit 200 includes the electro-optic element 210, an electro-optic element fixer 220, and a movement guide 230.

The electro-optic element 210, which serves to sense electromagnetic wave power, generates optical signal which is linearly proportional to the microwave power. This optical information is converted into electrical signal form according to a result of sensing the electromagnetic wave power.

The electro-optic element fixer 220 fixes the electro-optic element 210 so that the electro-optic element 210 does not move, and has a shape, for example, a cylindrical shape, for rotating the electro-optic element 210 on the movement guide 230. Therefore, the electro-optic element fixer 220 may rotate the electro-optic element 210 so that the electro-optic element 210 may be in a position for obtaining an optimal response characteristic. To this end, the electro-optic element fixer 220 may be formed in various shapes such as a groove, a screw, a tap, or the like so that the electro-optic element fixer 220 is allowed to rotate without being fixed to the movement guide 230. Furthermore, a groove, a hole, or the like for coupling the electro-optic element 210 may be formed near a center of the electro-optic element fixer 220.

One side of the movement guide 230 is coupled to the electro-optic element fixer 220, and another side of the movement guide 230 has a shape for receiving the waveguide guide 130 therein. The movement guide 230 may move on the waveguide guide 130 to control a position of the electro-optic element 210.

The movement guide 230 moves on the waveguide guide 130 so that the electro-optic element 210 is positioned between the parallel plates 140 in order to obtain the reference signal. Furthermore, the movement guide 230 moves on the waveguide guide 130 so that the electro-optic element 210 is positioned in the waveguide 110 in order to sense electromagnetic wave power. FIG. 1 exemplarily illustrates a movement direction 40 of the movement guide 230 with respect to the waveguide center line 20.

As described above, since the electromagnetic wave power sensing apparatus 10 proposed in the present disclosure senses electromagnetic wave power using the electro-optic element 210, a frequency band for measuring the electromagnetic wave power may be extended to the millimeter-wave or even higher, and a linearity may be ensured up to higher power regime. That is, the electromagnetic wave power sensing apparatus 10 proposed in the present disclosure may measure electromagnetic wave power without using elements that are limited in terms of a frequency band or nonlinear elements.

Figure 2:
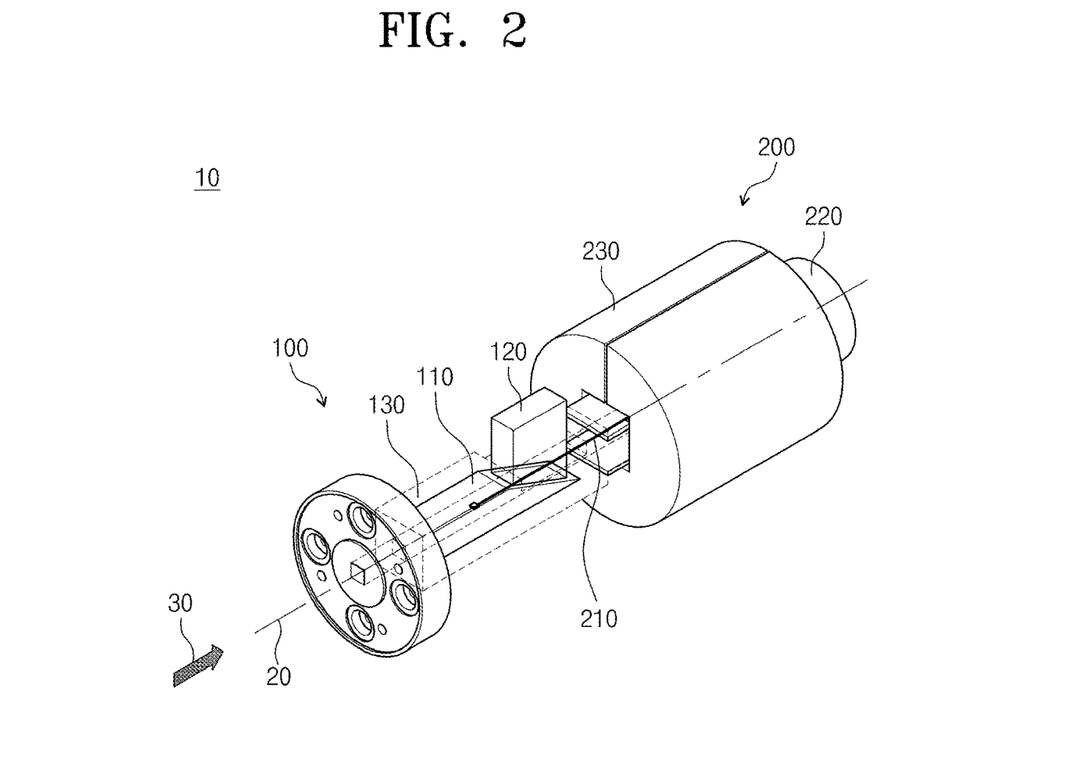
FIG. 2 is a diagram illustrating movement of the electromagnetic wave power sensing apparatus of FIG. 1.

FIG. 2 is a diagram illustrating movement of the electromagnetic wave power sensing apparatus of FIG. 1.

Referring to FIG. 2, in the electromagnetic wave power sensing apparatus 10, the waveguide unit 100 is coupled to the electro-optic element unit 200 via the waveguide guide 130.

When electromagnetic wave power is actually measured in response to incidence 30 of electromagnetic waves, the electro-optic element 210 (particularly, an end portion (electro-optic crystal) of the electro-optic element 210) may be required to be positioned in the waveguide 110, i.e., at the front of the electromagnetic wave absorber 120 in the waveguide 110.

To this end, once the movement guide 230 moves in a direction in which the waveguide guide 130 is introduced therein (i.e., in a direction in which the electromagnetic wave power is incident), the electro-optic element 210 is positioned in the waveguide 110.

Here, the electro-optic element 210 measures the electromagnetic wave power incident through the waveguide 110, and outputs a measured value.

Figure 3:
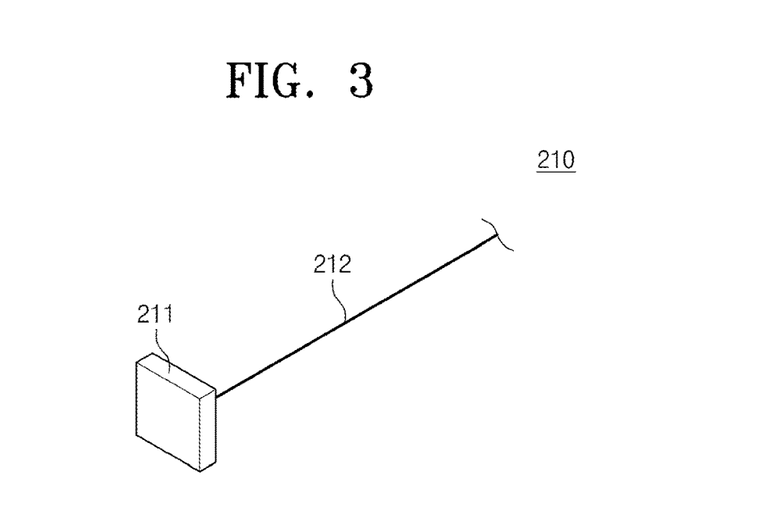
FIG. 3 is a diagram exemplarily illustrating the electro-optic element of FIG. 1.

FIG. 3 is a diagram exemplarily illustrating the electro-optic element of FIG. 1.

Referring to FIG. 3, the electro-optic element 210 may include an electro-optic crystal 211 and an optical fiber line 212. Here, for convenience, the electro-optic crystal 211 and the optical fiber line 212 are regarded as one electro-optic element. However, the electro-optic element 211 alone may be regarded as the electro-optic element.

The electro-optic crystal 211 generates an optically modulated signal according to electromagnetic wave power incident through a front surface of the electro-optic crystal 211. The electro-optic crystal 211 delivers the optical signal to the optical fiber line 212.

The optical fiber line 212 may deliver the optically modulated signal to a measuring detector or the like so as to provide, to the measuring detector or the like, the electric signal corresponding to measured electromagnetic wave power.

Figure 4:
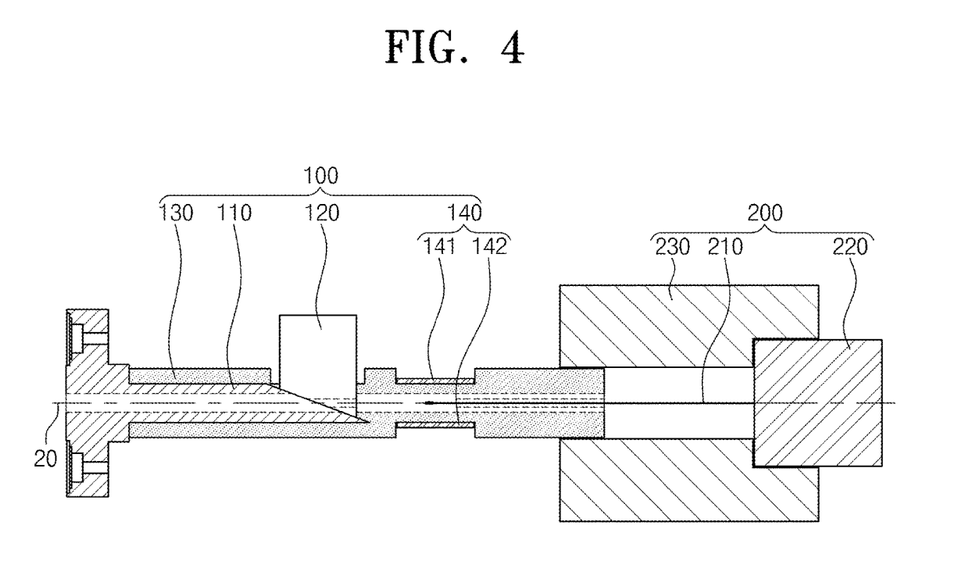
FIG. 4 is a sectional side view exemplarily illustrating the electromagnetic wave power sensing apparatus of FIG. 1 in which the electro-optic element is positioned between parallel plates.

FIG. 4 is a sectional side view exemplarily illustrating the electromagnetic wave power sensing apparatus of FIG. 1 in which the electro-optic element is positioned between the parallel plates 140.

Referring to FIG. 4, when the electro-optic element 210 is positioned between the parallel plates 140 of the waveguide unit 100, a reference voltage, a DC voltage, or a low-frequency voltage for obtaining a reference signal $V\_eo\_ref$ of the electro-optic element 210 is applied to the positive plate 141 and the negative plate 142 of the parallel plates 140. Here, the electro-optic element 210 outputs an electric signal, i.e., the reference signal $V\_eo\_ref$, in proportion to an applied DC voltage or low-frequency voltage.

An electric field is induced between the parallel plates 140 according to a distance d between the positive plate 141 and the negative plate 142 and a voltage V applied to the parallel plates 140. An amplitude of a response signal of the electro-optic element 210 varies with a direction of the electric field. Therefore, the electro-optic element fixer 220 may rotate the electro-optic element 210 positioned between the parallel plates, in which the electric field is generated, so that the electro-optic element 210 may be placed in a position in which an output of the electro-optic element 210 is maximized.

Figure 5:
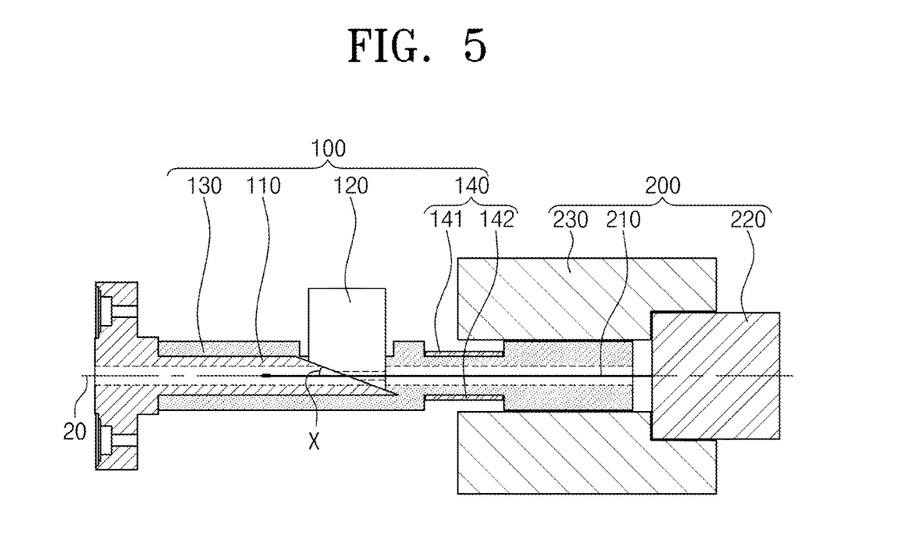
FIG. 5 is a sectional side view exemplarily illustrating the electromagnetic wave power sensing apparatus of FIG. 1 in which the electro-optic element is positioned in the waveguide.

After obtaining the reference signal, as illustrated in FIG. 5, the electro-optic element 210 moves through the movement guide 230 to sense electromagnetic wave power.

FIG. 5 is a sectional side view exemplarily illustrating the electromagnetic wave power sensing apparatus of FIG. 1 in which the electro-optic element is positioned in the waveguide.

Referring to FIG. 5, the electro-optic element 210 is positioned in the waveguide 110. Here, the electro-optic element 210 passes through the hole formed in the electromagnetic wave absorber 120 to move into the waveguide 110. Electromagnetic wave power incident to the waveguide 110 is converted into thermal energy and disappears when transferred to the electromagnetic wave absorber 120. Therefore, only incident electromagnetic wave power is applied to the electro-optic element 210.

Here, a part of the front surface of the electromagnetic absorber 120 positioned in an incidence direction of the electromagnetic wave power, i.e., a part of the electromagnetic absorber 120 adjacent to the inside of the waveguide, is inclined at a predetermined angle X with respect to the incidence direction of the electromagnetic wave power. By virtue of this structure, the amount of reflection is diminished by thermal dissipation due to the electromagnetic absorber 120.

Furthermore, the electro-optic element 210 outputs an electric signal, i.e., a sensing signal V_eo_rf, according to the incidence of the electromagnetic wave power.

Figure 6:
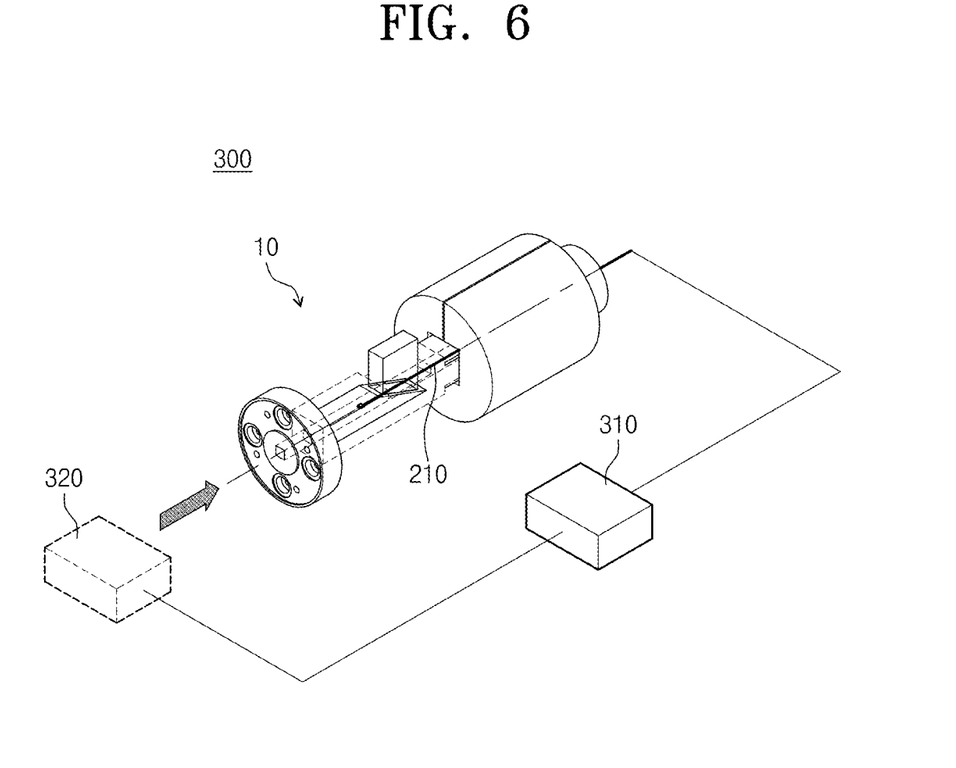
FIG. 6 is a diagram exemplarily illustrating an electromagnetic wave power measuring system using the electromagnetic wave power sensing apparatus of FIG. 1.

FIG. 6 is a diagram exemplarily illustrating an electromagnetic wave power measuring system using the electromagnetic wave power sensing apparatus of FIG. 1.

Referring to FIG. 6, an electromagnetic wave power sensing system 300 includes the electromagnetic wave power sensing apparatus 10 and a measuring apparatus 310. The measuring apparatus 310 may receive the reference signal V_eo_ref and the sensing signal V_eo_rf output from the electromagnetic wave power sensing apparatus 10.

The measuring apparatus 310 may receive the reference signal V_eo_ref via the optical fiber line 212 of the electro-optic element 210 when the electro-optic element 210 is positioned at a first location between the parallel plates 140 of the electromagnetic wave power sensing apparatus 10.

Thereafter, when the electro-optic element 210 is positioned at a second location in the waveguide 110 of the electromagnetic wave power sensing apparatus 10, the measuring apparatus 310 may receive the sensing signal V_eo_rf via the optical fiber line 212 of the electro-optic element.

The measuring apparatus 310 may receive the reference signal V_eo_ref and the sensing signal V_eo_rf and may measure electromagnetic wave power by comparing the received signals (V_eo_ref and V_eo_rf).

The measuring system 300 may be further provided with an electromagnetic wave power generator 320. The electromagnetic wave power generator 320 generates electromagnetic wave power according to various frequency bands.

The measuring apparatus 310 receives the reference signal V_eo_ref via the electro-optic element 210, and controls the electromagnetic wave power generator 320 so that the electromagnetic wave power generator 320 outputs electromagnetic wave power of various frequency bands. Here, upon receiving the sensing signal V_eo_rf of various frequency bands, the measuring apparatus 310 may provide and correct characteristics of the electro-optic element 210 by comparing the received signal with the reference signal V_eo_ref.

In the electromagnetic wave power sensing apparatus 10, the electro-optic element 210 may be replaced with another electro-optic element so as to provide and correct characteristics of each electro-optic element.

Figure 7:
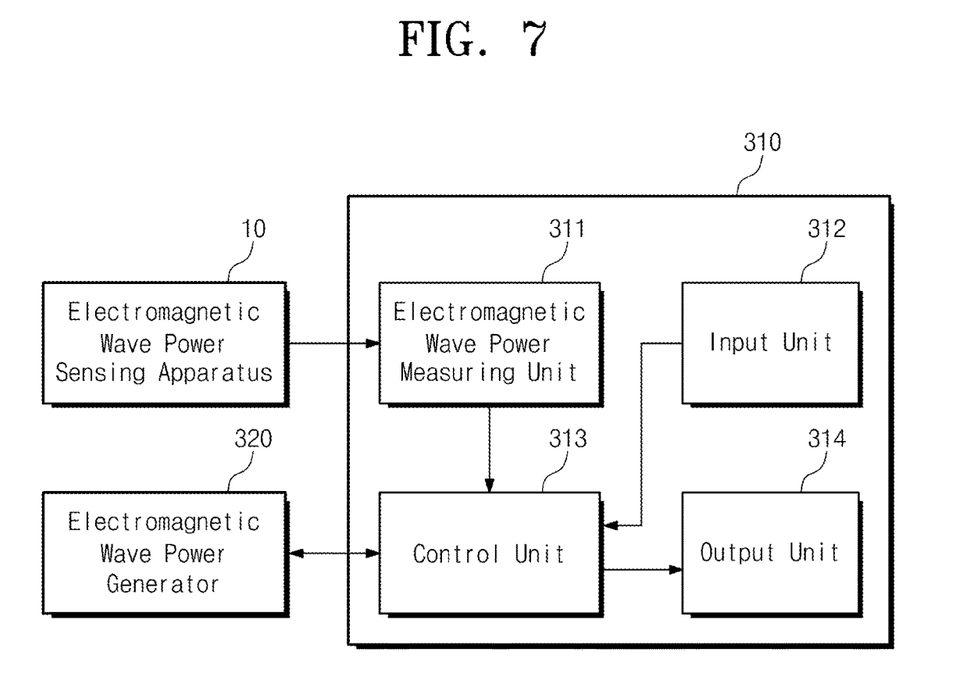
FIG. 7 is a diagram exemplarily illustrating the measuring apparatus of FIG. 6.

FIG. 7 is a diagram exemplarily illustrating the measuring apparatus of FIG. 6.

Referring to FIG. 7, the measuring apparatus 310 includes an electromagnetic wave power measuring unit 311, an input unit 312, a control unit 313, and an output unit 314.

The electromagnetic wave power measuring unit 311 measures an electric signal input via the optical fiber line of the electro-optic element 210. The electromagnetic wave power measuring unit 311 measures electric signals of the reference signal V_eo_ref and the sensing signal V_eo_rf, and outputs measured values to the output unit 314.

The input unit 312 may receive a user control signal for operating the measuring apparatus 310. The input unit 312 may output the user control signal to the control unit 313. The input unit 312 may receive the user control signal via various types of input devices such as a mouse, a keyboard, a touchpad, an electronic pen, etc.

The control unit 313 controls overall operation of the measuring apparatus 310. The control unit 313 may analyze a measured value received via the electromagnetic wave power measuring unit, and may output analyzed electromagnetic wave power via the output unit 314. Furthermore, in the case where the electromagnetic wave power generator 320 is provided, the control unit 313 may control the electromagnetic wave power generator 320 so that the electromagnetic wave power generator 320 outputs electromagnetic wave power in a specific frequency band.

The output unit 314 may output, via an output device such as a display unit, the electromagnetic wave power received from the control unit 313.

As described above, the electromagnetic wave power sensing apparatus proposed in the present disclosure may be installed in a precision electromagnetic wave power sensing apparatus such as a microcalorimeter so as to be used as a reference standard.

The electromagnetic wave power sensing apparatus according to an embodiment of the inventive concept may measure electromagnetic wave power using an electro-optic element, and may thus measure the electromagnetic wave power in a wide band frequency. Furthermore, since the electromagnetic wave power sensing apparatus does not use an element such as a nonlinear diode, the electromagnetic wave power sensing apparatus may accurately measure electromagnetic wave power by ensuring the linearity of measurement of the electromagnetic wave power.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. An electromagnetic wave power measuring apparatus comprising:
    a waveguide to which electromagnetic wave power is incident;
    an electromagnetic wave absorber disposed at a termination of the waveguide and absorbing the electromagnetic wave power incident to a front surface of the electromagnetic wave absorber;
    parallel plates disposed at a rear of the electromagnetic wave absorber and arranged on and under a center line of the waveguide;
    a waveguide guide for fixing the waveguide and the electromagnetic wave absorber, wherein the parallel plates are positioned in the waveguide guide;
    an electro-optic element configured to sense the electromagnetic wave power;
    an electro-optic element fixer to which the electro-optic element is coupled; and
    a movement guide coupled to the electro-optic element fixer and controlling movement of the electro-optic element into the inside of the waveguide guide in order to sense the electromagnetic wave power.

2. The electromagnetic wave power sensing apparatus of claim 1, wherein the movement guide controls the electro-optic element so that the electro-optic element is positioned between the parallel plates to measure a reference signal, and controls the electro-optic element so that the electro-optic element is positioned in the waveguide positioned at a front of the electromagnetic wave absorber to measure an electromagnetic wave power sensing signal.

3. The electromagnetic wave power sensing apparatus of claim 1, wherein the parallel plates receive one of a DC voltage and a low-frequency voltage as a reference voltage.

4. The electromagnetic wave power sensing apparatus of claim 3, wherein the parallel plates comprise a positive plate and a negative plate, wherein the positive plate and the negative plate are arranged in parallel with each other on the waveguide guide.

5. The electromagnetic wave power sensing apparatus of claim 4, wherein a positive plate insertion groove for inserting the positive plate and a negative plate insertion groove for inserting the negative plate are formed in the waveguide guide.

6. The electromagnetic wave power sensing apparatus of claim 4, wherein the waveguide guide has a hole formed therein so that the electro-optic element moves therethrough with respect to the center line of the waveguide.

7. The electromagnetic wave power sensing apparatus of claim 4, wherein the electro-optic element fixer has a structure rotatable on the movement guide so as to rotate the electro-optic element.

8. The electromagnetic wave power sensing apparatus of claim 1, wherein a part of the front surface of the electromagnetic wave absorber forms an inclined surface having a predetermined inclination with respect to the center line of the waveguide.

9. The electromagnetic wave power sensing apparatus of claim 8, wherein the electromagnetic wave absorber has a hole formed therein for allowing an electro-optic crystal of the electro-optic element moves forward on the waveguide.

10. The electromagnetic wave power sensing apparatus of claim 1, wherein the electro-optic element fixer has a structure rotating on the movement guide in order to obtain an optimal response characteristic from the electro-optic element.

11. A system comprising:
an electromagnetic wave power sensing apparatus configured to output a reference signal and a sensing signal according to a result of sensing an electromagnetic wave power signal through an electro-optic element; and
a measuring apparatus configured to receive the reference signal and the sensing signal to measure electromagnetic wave power,
wherein the electromagnetic wave power sensing apparatus comprises:
a waveguide to which electromagnetic wave power is incident;
an electromagnetic wave absorber disposed at a termination of the waveguide and absorbing the electromagnetic wave power incident to a front surface of the electromagnetic wave absorber;
parallel plates disposed at a rear of the electromagnetic wave absorber and arranged on and under a center line of the waveguide;
a waveguide guide for fixing the waveguide and the electromagnetic wave absorber, wherein the parallel plates are positioned in the waveguide guide;
an electro-optic element configured to sense the electromagnetic wave power;
an electro-optic element fixer to which the electro-optic element is coupled; and
a movement guide coupled to the electro-optic element fixer and placing the electro-optic element between the parallel plates to output the reference signal or placing the electro-optic element in the waveguide guide to output the sensing signal.

12. The system of claim 11, further comprising an electromagnetic wave power generator configured to output an electromagnetic wave power signal according to various frequency bands to the electromagnetic wave power sensing apparatus through control of the measuring apparatus.

13. The system of claim 11,
wherein the parallel plates comprise a positive plate and a negative plate arranged in parallel with each other on the waveguide guide,
wherein one of a DC voltage and a low-frequency voltage is applied as a reference voltage to the positive plate and the negative plate.

14. The system of claim 13, wherein a positive plate insertion groove for inserting the positive plate and a negative plate insertion groove for inserting the negative plate are formed in the waveguide guide.

15. The system of claim 14, wherein the waveguide guide has a hole formed therein so that the electro-optic element moves therethrough with respect to the center line of the waveguide.

16. The system of claim 11, wherein the electro-optic element fixer has a structure rotatable on the movement guide so as to rotate the electro-optic element.

17. The system of claim 11, wherein a part of the front surface of the electromagnetic wave absorber forms an inclined surface having a predetermined inclination with respect to the center line of the waveguide.

18. The system of claim 17, wherein the electromagnetic wave absorber has a hole formed therein for allowing an electro-optic crystal of the electro-optic element moves forward on the waveguide.

19. The system of claim 11, wherein the electro-optic element fixer has a structure rotating on the movement guide in order to obtain an optimal response characteristic from the electro-optic element.

* * * * *